United States Patent
Zhang

(10) Patent No.: US 11,349,467 B2
(45) Date of Patent: May 31, 2022

(54) OFFSET VOLTAGE CORRECTION CIRCUIT AND OFFSET VOLTAGE CORRECTION METHOD

(71) Applicant: CHANGXIN MEMORY TECHNOLOGIES, INC., Hefei (CN)

(72) Inventor: Zhiqiang Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/647,901

(22) Filed: Jan. 13, 2022

(65) Prior Publication Data

US 2022/0140824 A1 May 5, 2022

Related U.S. Application Data

(63) Continuation of application No. PCT/CN2021/103166, filed on Jun. 29, 2021.

(30) Foreign Application Priority Data

Sep. 2, 2020 (CN) .......................... 202010910741.9

(51) Int. Cl.
*H03L 5/00* (2006.01)
*H03K 5/24* (2006.01)
(Continued)

(52) U.S. Cl.
CPC ......... *H03K 5/2481* (2013.01); *G11C 7/1048* (2013.01); *H03F 3/45179* (2013.01); *H03M 1/1023* (2013.01)

(58) Field of Classification Search
CPC ............. H03F 3/45475; H03F 3/45183; H03F 3/45973; H03F 1/303; H03K 5/003
(Continued)

(56) References Cited

U.S. PATENT DOCUMENTS 9,660,660 B1 5/2017 Beukema et al.
10,862,494 B2 12/2020 Li
2010/0164589 A1\* 7/2010 Lee .................. H03F 3/45475
327/307

FOREIGN PATENT DOCUMENTS

CN 205945656 U 2/2017
CN 108011635 A 5/2018
(Continued)

OTHER PUBLICATIONS

International Search Report and English Translation cited in PCT/CN2021/103166 dated Sep. 26, 2021, 9 pages.
(Continued)

*Primary Examiner* — Quan Tra
(74) *Attorney, Agent, or Firm* — Cooper Legal Group, LLC

(57) ABSTRACT

The present disclosure provides an offset voltage correction circuit and an offset voltage correction method, including: a data obtaining module, configured to receive a data signal and a reference signal, and obtain a data indicator signal based on a comparison result of the reference signal and an offset data signal, the offset data signal being a data signal superimposed with an offset signal; a trimming enable module, configured to receive the data signal, the reference signal, the data indicator signal and an enable signal, obtain a theoretical indicator signal based on a comparison result of the data signal and the reference signal if the enable signal is of a high level, and generate an enable flag signal based on a comparison result of the theoretical indicator signal and the data indicator signal; and an offset correction module, configured to cancel the offset signal based on the enable flag signal.

13 Claims, 3 Drawing Sheets

(51) Int. Cl.
   *H03M 1/10* (2006.01)
   *H03F 3/45* (2006.01)
   *G11C 7/10* (2006.01)

(58) Field of Classification Search
   USPC .......................................................... 327/307
   See application file for complete search history.

(56) References Cited

FOREIGN PATENT DOCUMENTS

| CN | 108494371 A | * | 9/2018 |
| CN | 108494371 A | | 9/2018 |
| CN | 110138386 A | | 8/2019 |
| CN | 110149117 A | | 8/2019 |

OTHER PUBLICATIONS

Written Opinion and English Translation cited in PCT/CN2021/103166 dated Sep. 26, 2021, 7 pages.

* cited by examiner

OFFSET VOLTAGE CORRECTION CIRCUIT AND OFFSET VOLTAGE CORRECTION METHOD

CROSS-REFERENCE TO RELATED APPLICATIONS

The present disclosure is a continuation application of International Patent Application No. PCT/CN2021/103166, titled "OFFSET VOLTAGE CORRECTION CIRCUIT AND OFFSET VOLTAGE CORRECTION METHOD" and filed on Jun. 29, 2021, which claims the priority to Chinese Patent Application No. 202010910741.9, titled "OFFSET VOLTAGE CORRECTION CIRCUIT AND OFFSET VOLTAGE CORRECTION METHOD" and filed to the CNIPA on Sep. 2, 2020. The entire contents of International Patent Application No. PCT/CN2021/103166 and Chinese Patent Application No. 202010910741.9 are incorporated herein by reference.

TECHNICAL FIELD

The present disclosure relates to, but is not limited to, an offset voltage correction circuit and an offset voltage correction method.

BACKGROUND

Various operational amplifiers are widely used during signal transmission of memories. The operational amplifier is a basic analog circuit functional module and is widely used. However, the input stage of the operational amplifier will introduce an offset voltage.

When an input analog signal is converted into a digital signal by the operational amplifier, the analog signal may be converted mistakenly because of the input offset voltage of the operational amplifier. This process seriously affects the accuracy of signal transmission, and seriously affects the use of a memory accordingly.

SUMMARY

Some embodiments of the present disclosure provide an offset voltage correction circuit, including: a data obtaining module, configured to receive a data signal and a reference signal, and obtain a data indicator signal based on a comparison result of the reference signal and an offset data signal, the offset data signal being a data signal superimposed with an offset signal; a trimming enable module, configured to receive the data signal, the reference signal, the data indicator signal and an enable signal, obtain a theoretical indicator signal based on a comparison result of the data signal and the reference signal if the enable signal is of a high level, and generate an enable flag signal based on a comparison result of the theoretical indicator signal and the data indicator signal; and an offset correction module, configured to cancel the offset signal based on the enable flag signal.

An embodiment of the present disclosure further provides an offset voltage correction method, applied to a memory, including: receiving a data signal and a reference signal; obtaining a data indicator signal based on a comparison result of the reference signal and an offset data signal, the offset data signal being a data signal superimposed with an offset signal; obtaining an enable signal, and obtaining a theoretical indicator signal based on a comparison result of the data signal and the reference signal when the enable signal is of a high level; generating an enable flag signal based on a comparison result of the data indicator signal and the theoretical indicator signal; and canceling the offset signal based on the enable flag signal.

BRIEF DESCRIPTION OF THE DRAWINGS

The accompanying drawings incorporated into the description and constituting a part of the description illustrate the embodiments of the present disclosure, and are used together with the description to explain the principles of the embodiments of the present disclosure. In these drawings, similar reference numerals are used to indicate similar elements. The drawings in the following description are some embodiments of the present disclosure, but not all embodiments. For those skilled in the art, other drawings can be obtained from these drawings without any creative efforts.

DETAILED DESCRIPTION

At present, when an input analog signal is converted into a digital signal by an operational amplifier, the analog signal may be converted mistakenly because of an input offset voltage of the operational amplifier. This process seriously affects the accuracy of signal transmission, and seriously affects the use of a memory accordingly.

In order to solve the above problems, the first embodiment of the present disclosure provides an offset voltage correction circuit, including: a data obtaining module, configured to receive a data signal and a reference signal, and obtain a data indicator signal based on a comparison result of the reference signal and an offset data signal, the offset data signal being a data signal superimposed with an offset signal; a trimming enable module, configured to receive the data signal, the reference signal, the data indicator signal and an enable signal, obtain a theoretical indicator signal based on a comparison result of the data signal and the reference signal if the enable signal is a high level, and generate an enable flag signal based on a comparison result of the theoretical indicator signal and the data indicator signal; and an offset correction module, configured to cancel the offset signal based on the enable flag signal.

In order to make the objectives, technical solutions and advantages of the embodiments of the present disclosure clearer, the embodiments of the present disclosure will be described in detail below with reference to the accompanying drawings. However, those skilled in the art can understand that, in each embodiment of the present disclosure, many technical details are proposed in order to enable a reader to better understand the present disclosure. However, the technical solutions of the present disclosure can also be implemented without these technical details and various variations and modifications based on the following embodiments. The division of the following embodiments is for convenience of description, and should not constitute any limitation to the specific implementation of the present disclosure, and the various embodiments can be combined with each other under the premise of no contradiction.

Figure 1:
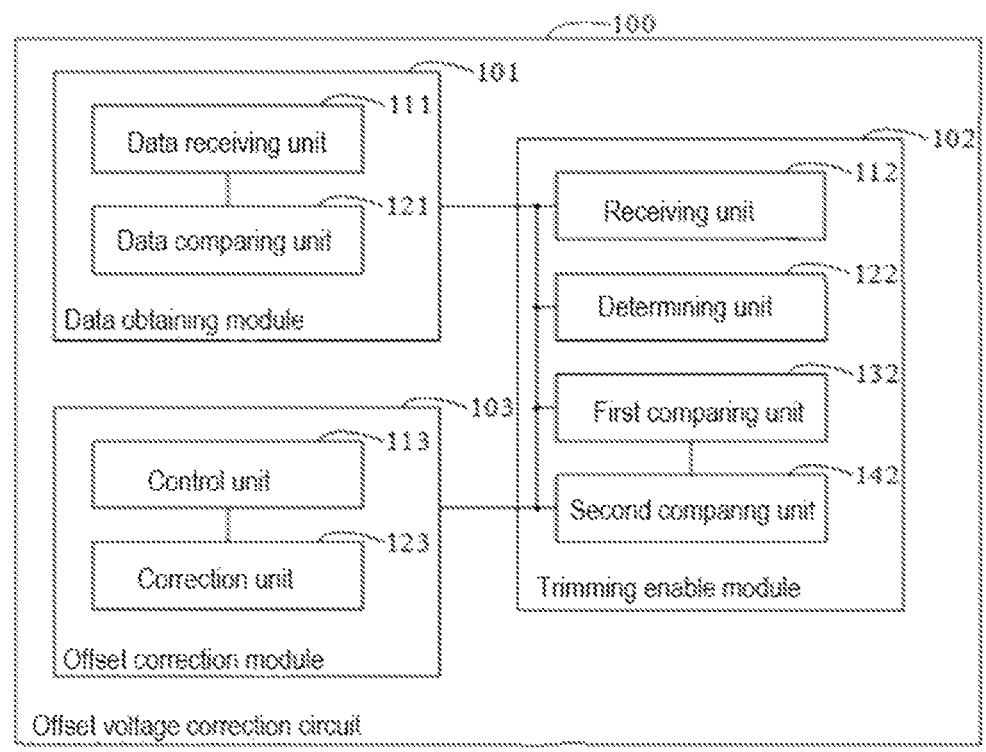
FIG. 1 is a schematic diagram of an analog structure of an offset voltage correction circuit provided by the first embodiment of the present disclosure.

FIG. 1 is a schematic diagram of an analog structure corresponding to the offset voltage correction circuit provided in this embodiment. The offset voltage correction circuit provided in this embodiment will be described in detail below with reference to FIG. 1.

Referring to FIG. 1, the offset voltage correction circuit 100 includes: a data obtaining module 101, a trimming enable module 102 and an offset correction module 103.

The data obtaining module 101 is configured to receive a data signal and a reference signal and obtain a data indicator signal based on a comparison result of the reference signal and an offset data signal, the offset data signal being a data signal superimposed with an offset signal.

The trimming enable module 102 is configured to receive the data signal, the reference signal, the data indicator signal and an enable signal, obtain a theoretical indicator signal based on a comparison result of the data signal and the reference signal if the enable signal is a high level, and generate an enable flag signal based on a comparison result of the theoretical indicator signal and the data indicator signal.

The offset correction module 103 is configured to cancel the offset signal generated in the data obtaining module 101 based on the enable flag signal.

The data obtaining module 101 includes a data receiving unit 111 and a data comparing unit 121.

The data receiving unit 111 has a first input end and a second input end, the first input end is configured to receive the data signal, and the second input end is configured to receive the reference signal.

The data comparing unit 121 has an input end connected to an output end of the data receiving unit 111, and is configured to compare the reference signal with the data signal superimposed with the offset signal to obtain the data indicator signal.

Figure 2:
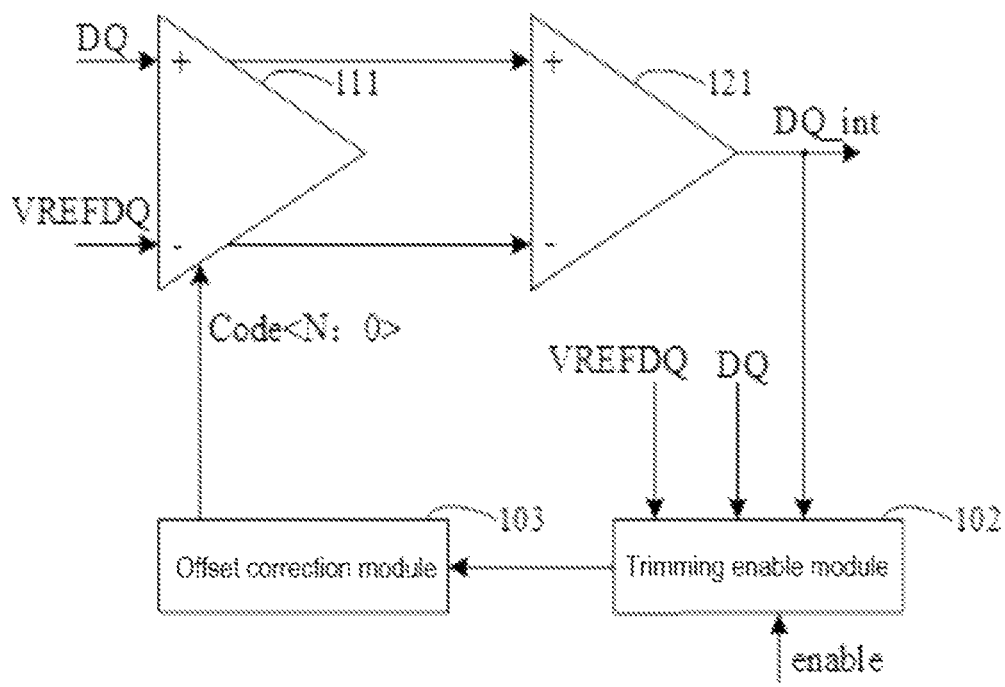
FIG. 2 is a schematic diagram of a specific structure of a data obtaining module provided by the first embodiment of the present disclosure.

Referring to FIG. 2, the data receiving unit 111 is an amplifier, and the data comparing unit 121 is a comparator; the first input end of the data receiving unit 111 is configured to receive the data signal, that is, the positive input end is configured to receive the data signal, the data signal is a DQ signal, and the DQ signal is a continuous analog signal; the second input end of the data receiving unit 111 is configured to receive the reference signal, that is, the negative input end is configured to receive the reference signal, the reference signal is a VREFDQ signal, and the VREFDQ signal is a continuous analog signal. The data receiving unit 111 amplifies the received DQ signal and the received VREFDQ signal and then inputs them to the data comparing unit 121, and the data comparing unit 121 compares the received signals to obtain the data indicator signal.

If the DQ signal is smaller than the VREFDQ signal, the data indicator signal obtained by the data comparing unit 121 is a low level, that is, the DQ_int signal is a low level; if the DQ signal is greater than the VREFDQ signal, the data indicator signal obtained by the data comparing unit 121 is a high level, that is, the DQ_int signal is a high level.

When the data receiving unit 111 receives the data signal and the reference signal, the offset signal is introduced and superimposed on the data signal. The data signal superimposed with the offset signal will cause the result of the data signal to be too large or too small, that is, the data signal originally larger than the reference signal becomes small, or the data signal originally smaller than the reference signal becomes large, resulting in an error in the obtained data indicating signal.

The amplifier as the data receiving unit 111 and the comparator as the data comparing unit 121 are an implementation of the data receiving unit 111 and the data comparing unit 121 provided in this embodiment, and do not constitute limitations to this embodiment.

In some embodiments of the present disclosure, the data receiving unit 111 at least includes a receiving differential amplifier circuit configured to amplify the received data signal and reference signal. The data signal and the reference signal are received by the differential amplifier circuit, so that the offset voltage correction circuit has a wide application range.

Figure 3:
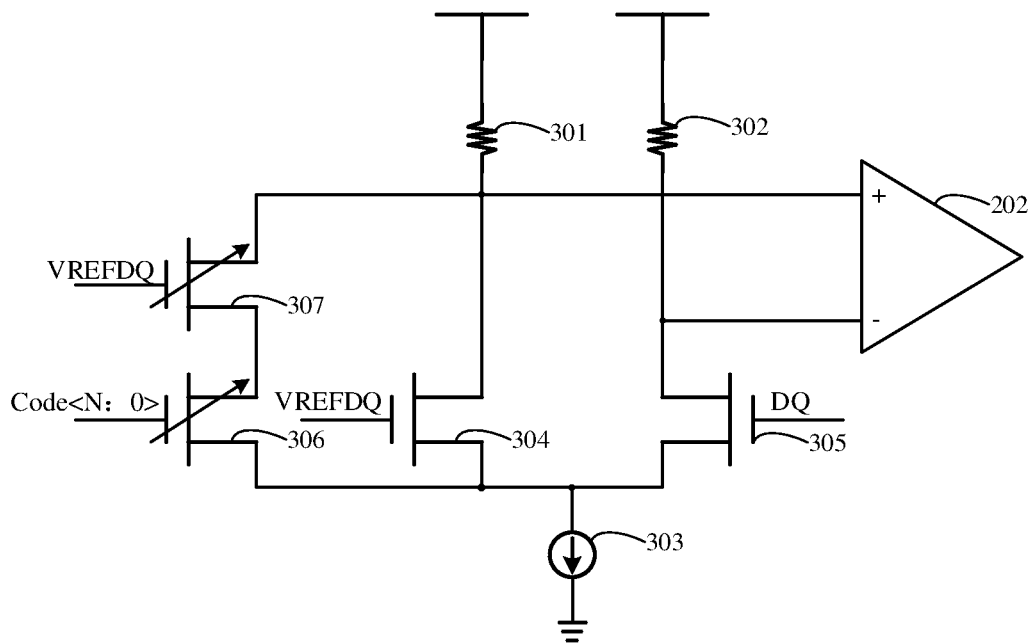
FIG. 3 is a schematic diagram of a specific structure of a data receiving unit provided by the first embodiment of the present disclosure.

Referring to FIG. 3, the receiving differential amplifier circuit includes a first differential MOS transistor 305 and a second differential MOS transistor 304, a gate of the first differential MOS transistor 305 is configured to receive the data signal, and a source of the first differential MOS transistor 305 is configured to connect a first load 302; a gate of the second differential MOS transistor 304 is configured to receive the reference signal, and a source of the second differential MOS transistor is configured to connect a second load 301; a drain of the first differential MOS transistor 305 and a drain of the second differential MOS transistor 304 are connected to the same current source 303, so that the first differential MOS transistor 305 and the second differential MOS transistor 304 constitute a differential pair.

In an embodiment of the present disclosure, the first load 302 and the second load 301 may use the same load circuit.

The second differential MOS transistor 304 is connected in parallel with a correction MOS transistor correction circuit, the correction circuit includes a correction switching MOS transistor 306 and a correction MOS transistor 307, and the correction MOS transistor 307 has a width-length ratio smaller than that of the second differential MOS transistor 304, which is used to change the equivalent width-length ratio of the second differential MOS transistor 304, thereby changing the amplification effect of the reference signal to cancel the offset signal.

Continuing to refer to FIG. 1, the trimming enable module 102 includes: a receiving unit 112, a determining unit 122, a first comparing unit 132 and a second comparing unit 142.

The receiving unit 112 is configured to receive the data signal, the reference signal, the data indicator signal and the enable signal.

The enable signal is generated based on a ZQCL (ZQ Calibration Long) command. The ZQCL command is an internal command of a memory for system power-on initialization and device reset in ZQ calibration. That is, the offset voltage correction circuit in this embodiment works based on an internal command and has a stable working environment and safety.

The determining unit 122 is configured to determine whether the enable signal is of a high level, and turn on the first comparing unit 132 and the second comparing unit 142 when the enable signal is of a high level.

That is, the trimming enable module 102 works based on the enable signal. When the enable signal is of a high level, the first comparing unit 132 and the second comparing unit 142 are turned on, and the trimming enable module 102 starts to work. When the enable signal is of a low level, the first comparing unit 132 and the second comparing unit 142 are turned off, and the trimming enable module 102 stops working.

The first comparing unit 132 is configured to compare the data signal and the reference signal, and obtain the theoretical indicator signal based on the comparison result of the data signal and the reference signal.

The second comparing unit 142 is configured to compare the theoretical indicator signal and the data indicator signal, and generate the enable flag signal based on the comparison result of the theoretical indicator signal and the data indicator signal.

When the theoretical indicator signal and the data indicator signal are the same, that is, the introduced offset voltage does not have much impact on the obtained data indicator signal, the generated enable flag signal is of a low level; when the theoretical indicator signal and the data indicator signal are different, the introduced offset voltage has a greater impact on the obtained data indicator signal, the generated enable flag signal is of a high level.

Continuing to refer to FIG. 1, the offset correction module 103 includes: a control unit 113 and a correction unit 123.

The control unit 113 is configured to receive the enable flag signal and generate a corresponding control signal based on the enable flag signal.

The correction unit 123 is configured to change the conduction status of an internal transistor array based on the control signal to compensate for the offset signal generated in the data obtaining module 101.

Figure 4:
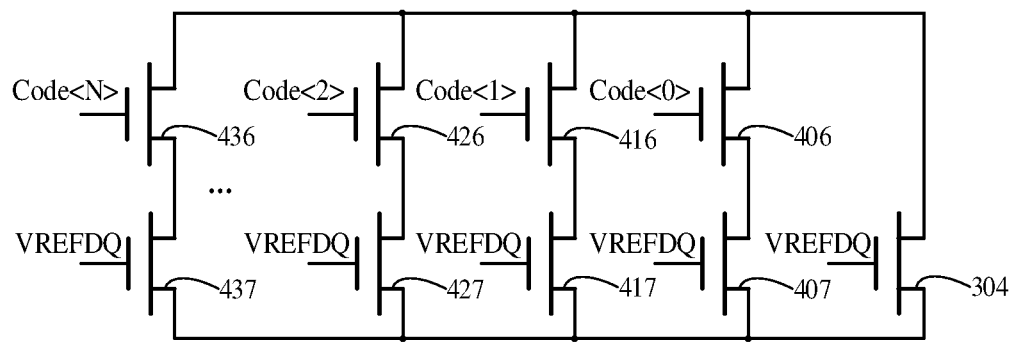
FIG. 4 is a schematic structure diagram of a correction MOS transistor array provided by the first embodiment of the present disclosure.

In some embodiments of the present disclosure, referring to FIG. 4, the correction unit 123 includes: a correction MOS transistor array connected in parallel with the second differential MOS transistor.

The correction MOS transistor array includes N branches of correction MOS transistors in parallel, width-length ratios of the N branches of correction MOS transistors increase exponentially according to the exponential relationship of 2, and the sum of equivalent width-length ratios of the N branches of MOS transistors is less than the width-length ratio of the second differential MOS transistor 304, where N is a natural number greater than or equal to 1.

If the width-length ratio of the correction MOS transistor 407 of the first branch is m, the width-length ratio of the correction MOS transistor 417 of the second branch is 2 m, the width-length ratio of the correction MOS transistor 427 of the third branch is 4 m, and the width-length ratio of the correction MOS transistor 437 of the N-th branch is $2^{N-1}$ m. At this time, the sum of equivalent width-length ratios of the N branches of correction MOS transistors is $(2^N-1)$m, which is less than the width-length ratio of the second differential MOS transistor 304, such that m is determined based on the set number N of array branches.

In some embodiments of the present disclosure, the correction MOS transistor array further includes: a switching MOS transistor connected in series with the correction MOS transistor on each branch; a drain of the correction MOS transistor is connected to the drain of the second differential MOS transistor, a source of the correction MOS transistor is connected to a drain of the switching MOS transistor, and the source of the switching MOS transistor is connected to the source of the second differential MOS transistor.

In an embodiment of the present disclosure, referring to FIG. 4, the correction MOS transistor 407 on the first branch of the correction MOS transistor array is connected to the first switching MOS transistor 406; the correction MOS transistor 417 on the second branch of the correction MOS transistor array is connected to the second switching MOS transistor 416; the correction MOS transistor 427 on the third branch of the correction MOS transistor array is connected to the third switching MOS transistor 426; and the correction MOS transistor 437 on the N-th branch of the correction MOS transistor array is connected to the N-th switching MOS transistor 436. The switching MOS transistor is configured to determine whether the branch is turned on based on the control signal, so as to change the equivalent width-to-length ratio of the second differential MOS transistor 304, thereby correspondingly amplifying the received reference signal to cancel the offset signal.

The control signal is Code<N: 0> shown in FIG. 2 and FIG. 3. Code<N: 0> is an N-bit binary number, 1 represents high level, 0 represents low level, the high level is used to turn on the corresponding branch of the correction MOS transistor array, and the low level is used to turn off the corresponding branch of the correction MOS transistor array. In an embodiment of the present disclosure, signals Code<4: 0> of four branches are used for description. For example, Code<4: 0> is 1110, that is, Code<0>=0, Code<1>=1, Code<2>=1, Code<3>=1; correspondingly, the second branch, the third branch and the fourth branch of the correction MOS transistor array are turned on, and the first branch of the correction MOS transistor array is turned off.

Figure 5:
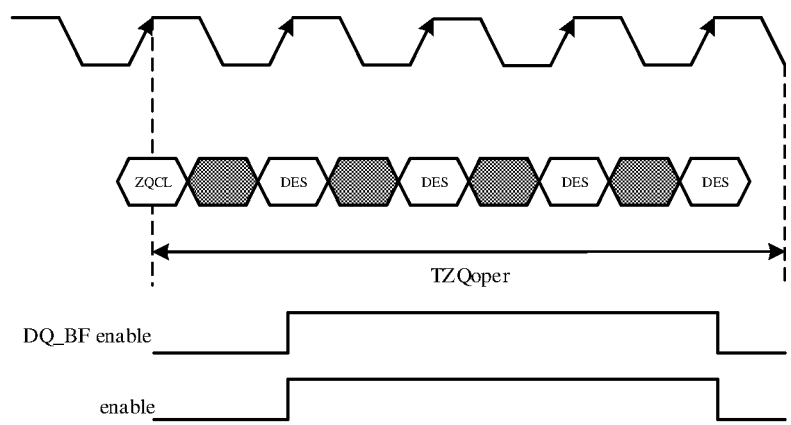
FIG. 5 is a schematic structure diagram of a correction time series provided by the first embodiment of the present disclosure.

Referring to FIG. 5, after the ZQCL command is received and after a clock delay, the DQ_BF enable signal and enable signal enabled based on the ZQCL command jump from a low level to a high level, the enable signal is used to control the trimming enable module 102 to work, the DQ_BF enable signal is used to control the offset correction module 103 to work, until the DQ_BF enable signal and the enable signal jump from the high level to a low level, and the correction stops; the period from receiving the ZQCL command until the correction stops is a correction time TZQoper controlled by the ZQCL command.

According to the offset voltage correction circuit proposed in the present disclosure, the trimming enable module is enabled through the enable signal, the trimming enable module generates the enable flag signal based on the comparison result of the theoretical indicator signal and the data indicator signal, and the offset correction module cancels, based on the enable flag signal, the offset signal generated in the data obtaining module, thereby ensuring the consistency of the data indicator signal and the theoretical indicator signal and avoiding an error in the obtained data indicator signal caused by the offset signal.

The modules involved in this embodiment are all logical modules. In practical applications, a logical unit may be a physical unit, a part of a physical unit, or a combination of a plurality of physical units. Moreover, in order to highlight the innovative part of the present disclosure, this embodiment does not introduce units that are not closely related to solving the technical problems proposed by the present disclosure, but this does not indicate that there are no other units in this embodiment.

The second embodiment of the present disclosure relates to an offset voltage correction method.

Figure 6:
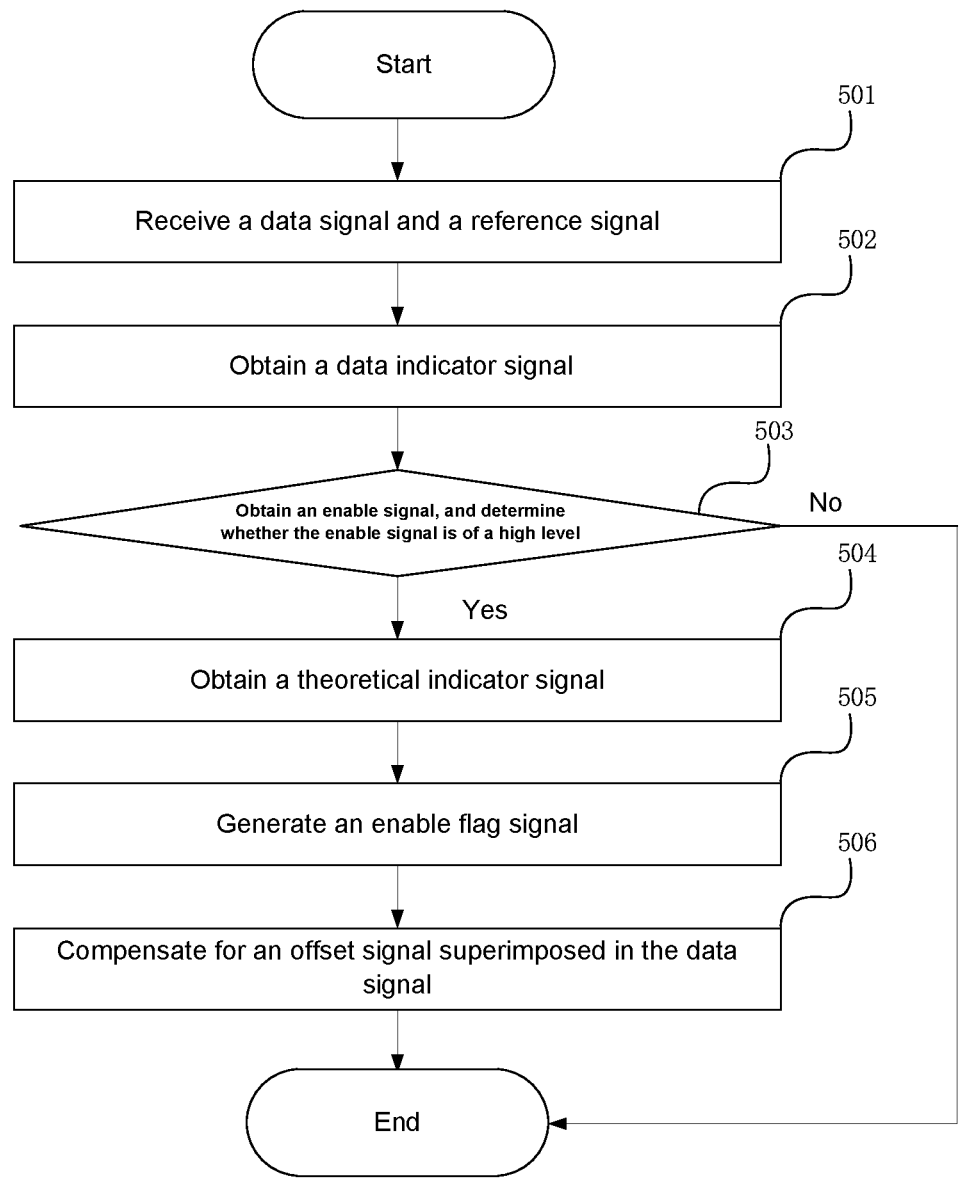
FIG. 6 is a schematic flowchart of an offset voltage correction method provided by the second embodiment of the present disclosure.

FIG. 6 is a schematic flowchart corresponding to the offset voltage correction method provided by this embodiment. The offset voltage correction method provided by this embodiment will be described in detail below in conjunction with FIG. 6. The same or corresponding parts as in the first embodiment will not be described in detail below.

Referring to FIG. 6, the offset voltage correction method includes:

Step 501: a data signal and a reference signal are received.

The data signal is an actual DQ signal received by the data obtaining module, and the actual DQ signal is a continuous analog signal. The reference signal is a VREFDQ signal, and the reference signal is compared with the actual DQ signal to obtain a signal for characterizing a high or low level, thereby controlling the corresponding function of a memory.

Step 502: a data indicator signal is obtained.

The data indicator signal is obtained based on a comparison result of the reference signal and an offset data signal, the offset data signal being a data signal superimposed with an offset signal. If the reference signal is greater than the data signal superimposed with the offset signal, the obtained data indicator signal is of a low level, that is, the DQ_int signal is of a low level; if the reference signal is smaller than the data signal superimposed with the offset signal, the obtained data indicator signal is of a high level, that is, the DQ_int signal is of a high level.

Step 503: an enable signal is obtained, and whether the enable signal is of a high level is determined.

The enable signal is obtained, and if the enable signal is of a high level, the correction of the offset signal is enabled, that is, step 504 is performed; if the enable signal is of a low level, then the correction of the offset signal is disabled, that is, the end step is performed.

The enable signal is generated based on a ZQCL (ZQ Calibration Long) command. The ZQCL command is an internal command of a memory for system power-on initialization and device reset in ZQ calibration. That is, the offset voltage correction circuit in this embodiment works based on an internal command and has a stable working environment and safety.

Step 504: a theoretical indicator signal is obtained.

The theoretical indicator signal is obtained based on a comparison result of the data signal and the reference signal. If the reference signal is greater than the data signal, the obtained theoretical indicator signal is of a low level; if the reference signal is smaller than the data signal, the obtained theoretical indicator signal is of a high level.

Step 505: an enable flag signal is generated.

The enable flag signal is generated based on a comparison result of the data indicator signal and the theoretical indicator signal. When the theoretical indicator signal and the data indicator signal are the same, that is, the introduced offset voltage does not have much impact on the obtained data indicator signal, the generated enable flag signal is of a low level; when the theoretical indicator signal and the data indicator signal are different, the introduced offset voltage has a greater impact on the obtained data indicator signal, the generated enable flag signal is of a high level.

Step 506: the offset signal superimposed in the data signal is compensated.

The offset signal superimposed in the data signal is compensated based on the enable flag signal.

The status of the enable flag signal is determined; if the enable flag signal is of a high level, a corresponding control signal is generated based on the enable flag signal; if the enable flag signal is of a low level, no control signal is generated. The offset correction module is adjusted based on the control signal to cancel the offset signal.

In an embodiment of the present disclosure, the method for adjusting the offset correction module includes: obtaining, based on the control signal, a target on-off status of each MOS transistor in the correction MOS transistor array; obtaining an actual on-off status of each MOS transistor in the correction MOS transistor array; adjusting the actual on-off status based on the target on-off status; and changing the reference signal to compensate for the offset signal superimposed in the data signal.

Compared with the prior art, the offset voltage correction method is enabled through the enable signal, the enable flag signal is generated based on the comparison result of the theoretical indicator signal and the data indicator signal, and the generated offset signal is cancelled based on the enable flag signal, thereby ensuring the consistency of the data indicator signal and the theoretical indicator signal and avoiding an error in the obtained data indicator signal caused by the offset signal.

The division of the above various steps is only for clarity of description. When implemented, the steps can be combined into one step or some steps can be split into a plurality of steps, as long as they comprise the same logical relationship, they fall all within the protection scope of this disclosure. Insignificant modifications added or insignificant designs introduced to the process without changing the core design of the process all fall within the protection scope of this disclosure.

Since the first embodiment corresponds to this embodiment, this embodiment can be implemented in cooperation with the first embodiment. Relevant technical details mentioned in the first embodiment are still valid in this embodiment, and the technical effects that can be achieved in the first embodiment can also be achieved in this embodiment. In order to reduce repetition, details are not described herein again. Correspondingly, the relevant technical details mentioned in this embodiment can also be applied to the first embodiment.

A person skilled in the art would easily conceive of other embodiments of the present disclosure after considering the disclosure of the description and practice. The present disclosure is intended to cover any variations, uses or adaptive changes of the present disclosure. These variations, uses or adaptive changes follow the general principle of the present disclosure and comprise common general knowledge or conventional technical means in the technical field that are not disclosed in the present disclosure. The description and the embodiments are merely regarded as exemplary, and the real scope and spirit of the present disclosure are pointed out by the following claims.

It should be understood that the present disclosure is not limited to the precise structure described above and shown in the drawings, and various modifications and changes can be made without departing from its scope. The scope of the present disclosure is only limited by the appended claims.

INDUSTRIAL APPLICABILITY

According to the offset voltage correction circuit and the offset voltage correction method proposed in the present disclosure, the offset voltage correction method is enabled through the enable signal, the enable flag signal is generated based on the comparison result of the theoretical indicator signal and the data indicator signal, and the generated offset signal is cancelled based on the enable flag signal, thereby ensuring the consistency of the data indicator signal and the theoretical indicator signal and avoiding an error in the obtained data indicator signal caused by the offset signal.

The invention claimed is:

1. An offset voltage correction circuit, wherein the offset voltage correction circuit comprises:
 a data obtaining module, configured to receive a data signal and a reference signal, and obtain a data indicator signal based on a comparison result of the reference signal and an offset data signal, the offset data signal being a data signal superimposed with an offset signal;

a trimming enable module, configured to receive the data signal, the reference signal, the data indicator signal and an enable signal, obtain a theoretical indicator signal based on a comparison result of the data signal and the reference signal if the enable signal is of a high level, and generate an enable flag signal based on a comparison result of the theoretical indicator signal and the data indicator signal; and an offset correction module, configured to cancel the offset signal based on the enable flag signal.

2. The offset voltage correction circuit according to claim 1, wherein the data obtaining module comprises:

a data receiving unit, having a first input end and a second input end, the first input end being configured to receive the data signal, and the second input end being configured to receive the reference signal; and a data comparing unit, having an input end connected to an output end of the data receiving unit, and configured to compare the reference signal with the data signal superimposed with the offset signal to obtain the data indicator signal.

3. The offset voltage correction circuit according to claim 2, wherein the data receiving unit comprises at least a receiving differential amplifier circuit configured to amplify the received data signal and reference signal.

4. The offset voltage correction circuit according to claim 3, wherein the receiving differential amplifier circuit comprises: a first differential MOS transistor and a second differential MOS transistor;

a gate of the first differential MOS transistor is configured to receive the data signal, and a source of the first differential MOS transistor is configured to connect a first load; a gate of the second differential MOS transistor is configured to receive the reference signal, and a source of the second differential MOS transistor is configured to connect a second load;

a drain of the first differential MOS transistor and a drain of the second differential MOS transistor are connected to the same current source, so that the first differential MOS transistor and the second differential MOS transistor constitute a differential pair.

5. The offset voltage correction circuit according to claim 4, wherein the first load and the second load use the same load circuit.

6. The offset voltage correction circuit according to claim 2, wherein the data comparing unit comprises a comparator.

7. The offset voltage correction circuit according to claim 1, wherein the trimming enable module comprises:

a receiving unit, configured to receive the data signal, the reference signal, the data indicator signal and the enable signal;

a determining unit, configured to determine whether the enable signal is of a high level, and turn on a first comparing unit and a second comparing unit when the enable signal is of a high level;

the first comparing unit, configured to compare the data signal and the reference signal, and obtain the theoretical indicator signal based on the comparison result of the data signal and the reference signal; and the second comparing unit, configured to compare the theoretical indicator signal and the data indicator signal, and generate the enable flag signal based on the comparison result of the theoretical indicator signal and the data indicator signal.

8. The offset voltage correction circuit according to claim 4, wherein the offset correction module comprises:

a control unit, configured to receive the enable flag signal and generate a corresponding control signal based on the enable flag signal; and a correction unit, configured to change a conduction status of an internal transistor array based on the control signal to cancel the offset signal.

9. The offset voltage correction circuit according to claim 8, wherein the correction unit comprises:

a correction MOS transistor array connected in parallel with the second differential MOS transistor;

the correction MOS transistor array comprises: N branches of correction MOS transistors in parallel;

width-length ratios of the N branches of correction MOS transistors increase exponentially according to an exponential relationship of 2, and a sum of equivalent width-length ratios of the N branches of MOS transistors is less than a width-length ratio of the second differential MOS transistor;

wherein N is a natural number greater than or equal to 1.

10. The offset voltage correction circuit according to claim 9, wherein the correction MOS transistor array further comprises: a switching MOS transistor connected in series with the correction MOS transistor on each branch;

a drain of the correction MOS transistor is connected to a drain of the second differential MOS transistor, a source of the correction MOS transistor is connected to a drain of the switching MOS transistor, and a source of the switching MOS transistor is connected to a source of the second differential MOS transistor;

the switching MOS transistor is configured to determine whether the branch is turned on based on the control signal.

11. An offset voltage correction method, applied to a memory, wherein the offset voltage correction method comprises:

receiving a data signal and a reference signal;

obtaining a data indicator signal based on a comparison result of the reference signal and an offset data signal, the offset data signal being a data signal superimposed with an offset signal;

obtaining an enable signal, and obtaining a theoretical indicator signal based on a comparison result of the data signal and the reference signal when the enable signal is of a high level;

generating an enable flag signal based on a comparison result of the data indicator signal and the theoretical indicator signal; and canceling the offset signal based on the enable flag signal.

12. The offset voltage correction method according to claim 11, wherein the canceling the offset signal based on the enable flag signal comprises:

determining a status of the enable flag signal;

generating a corresponding control signal based on the enable flag signal if the enable flag signal is of a high level; not generating a control signal if the enable flag signal is of a low level; and adjusting an offset correction module based on the control signal to cancel the offset signal.

13. The offset voltage correction method according to claim 12, wherein the adjusting an offset correction module based on the control signal to cancel the offset signal comprises:

obtaining, based on the control signal, a target on-off status of each MOS transistor in a correction MOS transistor array;

obtaining an actual on-off status of each MOS transistor in the correction MOS transistor array; and adjusting the actual on-off status based on the target on-off status.

\* \* \* \* \*